United States Patent [19]

Moran et al.

[11] Patent Number: 4,672,418

[45] Date of Patent: Jun. 9, 1987

[54] INTEGRATED CIRCUIT PACKAGES

[76] Inventors: Peter Moran, 3 Falcon Hill, Lovers Walk, Montenotte, Cork, Ireland; Barry Vyse, 14 Cranbourne Drive, Pinner, Middlesex, England

[21] Appl. No.: 721,236

[22] Filed: Apr. 8, 1985

[30] Foreign Application Priority Data

Apr. 11, 1984 [GB] United Kingdom ............... 8409314

[51] Int. Cl.[4] ............... H01L 23/30; H01L 23/48; H01L 23/04
[52] U.S. Cl. ............... 357/70; 357/74; 357/72
[58] Field of Search ............... 357/70, 74, 72; 174/52 FP

[56] References Cited

U.S. PATENT DOCUMENTS 3,673,309 6/1972 Dalmasso ............... 174/52 FP
3,909,838 9/1975 Beyerlein ............... 357/72
4,218,701 8/1980 Shirasaki ............... 357/70
4,463,217 7/1984 Orcutt ............... 357/74
4,530,002 7/1985 Kanai ............... 357/70
4,554,404 11/1985 Gilder, Jr. et al. ............... 174/52 FP Primary Examiner—Andrew J. James
Assistant Examiner—S. V. Clark
Attorney, Agent, or Firm—Kirschstein, Kirschstein, Ottinger & Israel

[57] ABSTRACT

An integrated circuit package including a lead frame (11) sealed between base and cap portions (1 and 3) of the package enclosure. Outwards of the seal each lead (13) in the frame (11) follows an angled path so that manipulation of leads outside the package is unlikely to damage the seal. The angling of the leads (13) is effected by appropriately shaping the cap and base parts (1 and 3) of the package.

12 Claims, 5 Drawing Figures

INTEGRATED CIRCUIT PACKAGES

BACKGROUND OF THE INVENTION

1. Field of the Invention

This invention relates to packages for integrated circuits, more especially for very large scale integrated circuits.

2. Description of the Related Art

Such packages essentially comprise an enclosure for housing an integrated circuit and a plurality of leads extending through the enclosure wall, the inner end of each lead being adapted for connection to an integrated circuit housed in the enclosure and the outer end of each lead being adapted for external connection e.g. to a conductor of a printed circuit board. Normally the enclosure is required to be capable of being hermetically sealed after insertion of the integrated circuit in the enclosure and connection of the leads to the integrated circuit.

In a known form of such a package, the leads emerge from the enclosure via a seal between flat surfaces of two parts of ceramic material forming the enclosure. Consequently, when the package is placed on a circuit board the leads are slightly spaced from the board and require to be formed to some extent to facilitate soldering to conductors on the board. This forming operation frequently causes failure of the hermetic seal between the leads and the ceramic parts.

A further problem with such packages is the increasing fragility of the leads with increasing lead density, with a resultant increase in the possibility of damage to or misplacement of, the protruding outer ends of the leads during manipulation of the package for testing purposes and attachment of the package to a circuit board.

SUMMARY OF THE INVENTION

It is an object of the present invention to provide a package for an integrated circuit whereby the above-mentioned problems are alleviated.

According to the present invention there is provided a package for an integrated circuit comprising a pair of parts sealed together to form an enclosure for housing an integrated circuit, and a plurality of leads for making electrical connections between an integrated circuit housed in the enclosure and points external of said enclosure, which leads extend via the seal between said parts, characterised in that outwardly of at least part of said seal each lead is constrained by said enclosure to follow an angled path.

Preferably each said lead has a first angled portion outwardly of at least part of said seal, and outwardly of said first angled portion each lead has a complementary second angled portion so that the parts of the leads within the enclosure lie substantially in a first plane and the parts of the leads outside the enclosure lie substantially in a second plane parallel to and spaced from said first plane.

Preferably said second plane is substantially coplanar with an external surface of the enclosure.

Said first and second angled portions are suitably substantially right-angled portions.

In one particular embodiment of the invention said pair of parts comprises a first planar part and a second part comprising a planar portion having a peripheral flange, the planar portion of the second part being sealed to the first part with the flange fitting closely around the periphery of the first part and said leads sandwiched between the adjacent surfaces of the first and second parts, the first and second angled portions of each lead respectively conforming to the outer edge of said first part and the inner edge of the flange of said second part.

BRIEF DESCRIPTION OF THE DRAWINGS

One package in accordance with the invention and its method of manufacture will now be described, by way of example, with reference to the accompanying drawing in which.

DETAILED DESCRIPTION OF THE PREFERRED EMBODIMENTS

Figure 1:
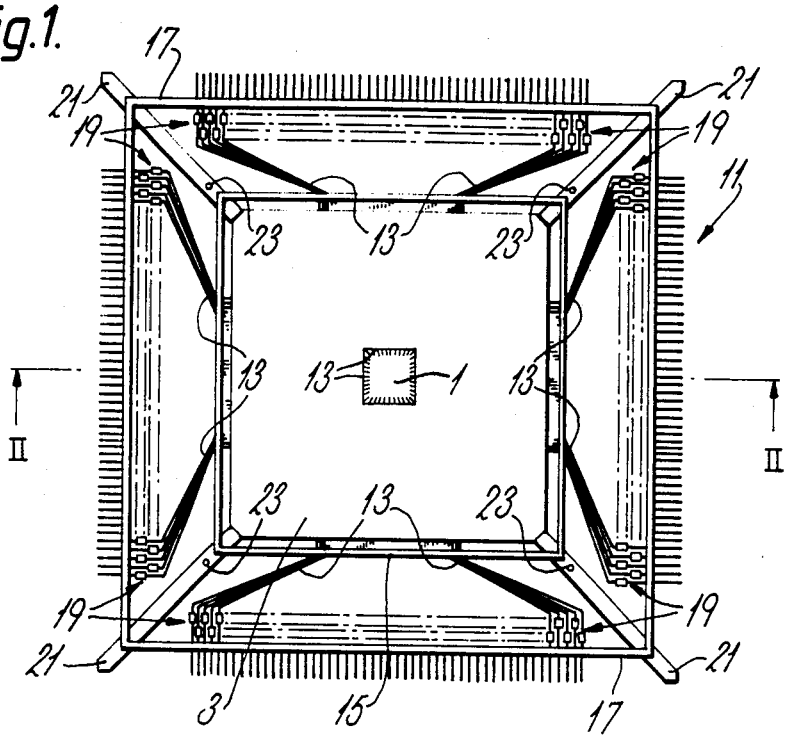
FIG. 1 is a plan view of the package.

Referring to the drawings, the package includes base part 1 in the form of a rectangular plate of ceramic material, e.g. alumina, and a rectangular ceramic cap part 3. The cap part 3 comprises a planar portion 5 having a central rectangular aperture 7 and a flange portion 9 which extends all around the outer periphery of the planar portion 5, the flange portion 9 having a height substantially equal to the thickness of the base part 1.

The planar portion 5 of the cap part 3 is sealed to the base part 1, by a glass seal 10 as hereinafter described, with a lead frame 11 sandwiched between the cap and base parts.

The lead frame 11, which is suitably manufactured from thin nickel-iron alloy sheet by photo etching, includes a large number of leads 13 each extending outwardly from a point slightly inwards of the edge of the central aperture 7 in the cap part 3, the leads being divided into four groups each of which extends along a different side of the base part 1. Each lead 13 is spaced from the leads on either side, the leads fanning out from their inner ends to near the edge of the base part 1.

The leads then extend in parallel spaced relationship, crossing the edge of the base part 1 at right angles, these parallel parts of the leads being supported just beyond the edge of the base part 1 by a rectangular support frame 15 of an electrically insulating material, e.g. a plastics material, suitably a polyimide material. Where it extends beyond the base part 1 each of the leads 13 has two complementary spaced right angle bend portions so as to conform to the outer edges of the base part 1 and the inner edge of the flange 9 on the cap part 3. The leads 13 then fan out again to a point short of a second rectangular support frame 17, extending across and slightly beyond the frame 17 in parallel spaced relationship. Between the outer end of the second fan out and the second frame 17 each lead 13 includes an enlarged rectangular contact pad area 19 for test purposes.

Typically the lead frame includes two hundred leads 13, fifty leads being disposed along each of the four sides of the package with a pitch of 0.2 millimetres at their inner ends and a pitch of 0.5 mm at their outer ends.

From each corner of the base part 1, through the seal between the base part 1 and cap part 3, there extends at 45° a strip 21 of the same material as but greater cross-sectional area than the leads 13, each strip 21 having a hole 23 formed in it at some point along its length to assist accurate positioning of the package in use, and being secured to the support frames 15 and 17 where it crosses them.

In use of the package an integrated circuit die (not shown) is placed centrally on the base part 1 and contacts on the die are connected to the inner ends of the leads 13 by flying leads. The circuit may then be tested using the contact pads 19 using the holes 23 for alignment purposes.

Figure 2:
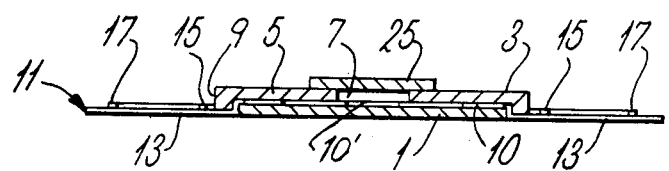
FIG. 2 is a sectional view along the line II—II in FIG. 1.

A lid 25 in the form of a rectangular ceramic plate (shown only in FIG. 2) may then be sealed over the central aperture 7 in the cap part 3, using any convenient conventional sealing technique, to hermetically seal the enclosure.

After sealing on the lid 25, the parts of the leads 13 and strips 21 extending beyond the enclosure may be shortened, for example, so as to remove the test pads 19 and the support frame 17, but leaving the holes 23 to facilitate alignment of the package leads with conductors on a printed circuit board to which they are to be soldered.

It will be appreciated that the package is placed on the printed circuit board with the face of the base part 1 which is substantially coplanar with the ends of the leads 13 outside the package in contact with the board so that the leads require a minimum of manipulation to position them suitably for soldering. Furthermore, due to the right angled bends in the leads 13, manipulation of the parts of the leads outside the enclosure puts very little stress on the hermetic seal between the base part 1 and cap part 3 where the leads 13 pass through the seal.

It will be apparent that due to heat conduction by contact of parts of the leads outwards of the seal with either or both of the base and cap parts 1 and 3, the seal between the base and cap parts and the lead frame is not subjected to severe thermal shock during soldering.

Figure 3:
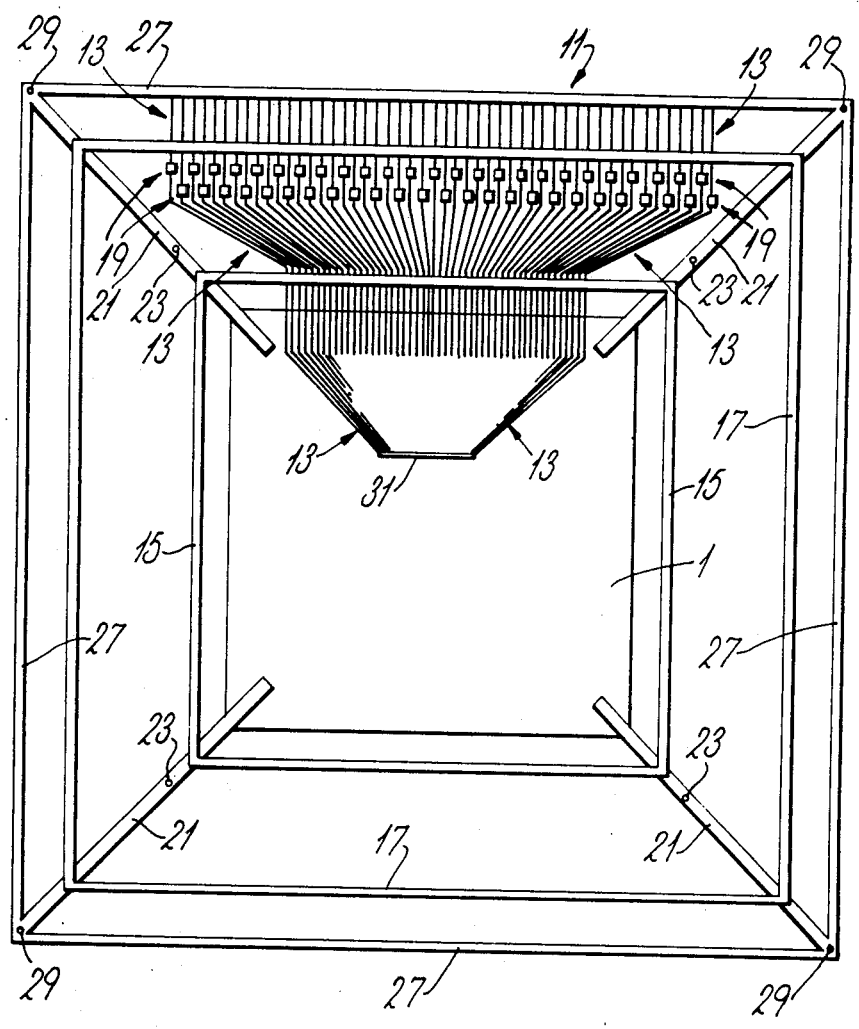
FIG. 3 is an enlarged plan view of the package at a stage during manufacture.

The method of making the package will now be described with reference particularly to FIG. 3 which shows the package at a stage before sealing of the cap part 3 to the base part 1, FIG. 3 showing one group only of the leads 13 for simplicity. In making the package the lead frame is initially fabricated so as to include an integral outer rectangular rim 27 which connects and supports the outer ends of the leads 13 and the strips 21, the rim being provided at each corner with a hole 29 for positioning purposes. The lead frame 11 as initially fabricated also includes four strips 31 each of which connects and supports the inner ends of a different one of the four groups of leads 13.

After fabrication of the lead frame 11 the two support frames 15 and 17 are secured to the frame and the two right angled bends in the leads are formed. The lead frame 11 is then sealed to the base part 1 of the package using a film of glass frit deposited on the appropriate face of the base part 1 by any suitable conventional technique, or using a glass preform interposed between the base part 1 and the lead frame 11. This assembly is then heated under pressure to cause the glass to penetrate between the individual leads 13 of the frame 11 and seal it to the base part 1, the volume of glass used being sufficient to ensure that the surface of the glass finishes flush with the surface of the lead frame 11 remote from the base part 1. The four inner interconnection strips 31 and outer interconnection rim 27 are then removed. It will be appreciated that prior to this last operation the holes 23 and 29 are available for positioning purposes.

A further glass preform is then used to seal the cap part 3 of the package to the lead frame and base part assembly.

Figure 4:
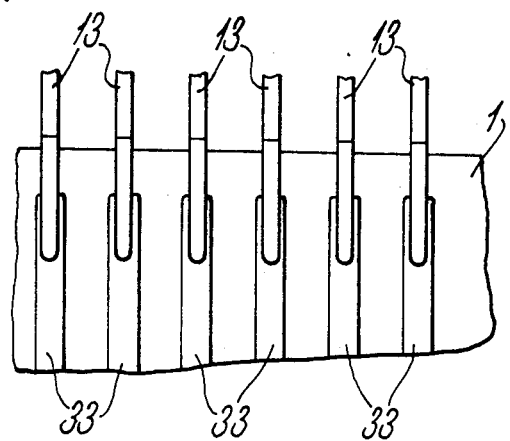
FIG. 4 is an enlarged plan view of a part of a modified form of the package at a stage during manufacture.

Referring to FIG. 4, in a modification of the package described above by way of example, the inner ends of the leads 13 are connected to metallised areas 33 formed on the appropriate surface of the base part 1 of the package, which areas thus form inward extensions of the leads to which extensions the flying leads from the integrated circuit die are bonded in use of the package. The leads of the frame 11 are consequently then made of a length sufficient only to overlap the metallised areas 33 on the base part 1 at their inner ends, the overlapping parts of the leads and metallisation being thermo compression bonded prior to sealing of the lead frame to the base part using glass frit or a glass preform as described above.

Figure 5:
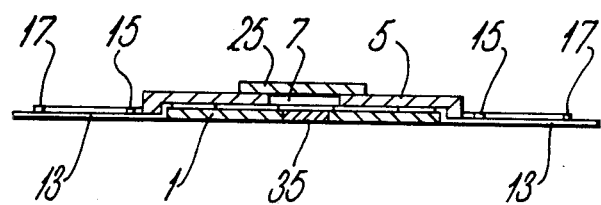
FIG. 5 is a sectional view of a further modified form of the package.

Referring to FIG. 5, in a further modification of the package described by way of example, a brazed metal plug or other insert member 35 of high thermal conductivity is inserted in a hole at the centre of the base part 1 where the integrated circuit is placed in use to improve conduction of heat from the circuit.

We claim:
1. An integrated circuit package comprising:
(a) a base part in the form of a rectangular plate having an upper surface, a lower planar surface, and an outer periphery,
(b) an integrated circuit element mounted on the upper surface of said base part,
(c) a cap part in the form of a rectangular planar portion having a peripheral flange having an inner surface which is a close fit around the outer periphery of said base part,
(d) sealing means sealing said planar portion of said cap part to said base part to form an enclosure for said integrated circuit element,
(e) connecting leads extending from said integrated circuit element through said sealing means, each said connecting lead having:
(f) a first portion extending outwardly with respect to said sealing means between said planar portion of the cap part and the upper surface of the base part,
(g) an intermediate portion extending at right angles to said first portion and between the inner surface of said peripheral flange and the outer periphery of said base part,
(h) a second portion for connection to other circuit elements extending at right angles to said intermediate portion and outwardly beyond said peripheral flange in a plane which is substantially coplanar and flush with the lower surface of said base part,
(i) a pair of respective inner and outer rectangular lead frames spaced apart of each other and both concentrically surrounding said base part, and supporting said second portions of said connecting leads, and
(j) said second portions of said connecting leads fanning outwardly in the space between said inner and outer lead frames.

2. An integrated circuit package as claimed in claim 1, wherein the cap part has a central opening in which the circuit element is hused, and a lid is sealed over said opening to complete the enclosure.

3. An integrated circuit package as claimed in claim 1, and further comprising four strips, each strip extending from an apex of the rectangular base plate to the corresponding apices of said inner and outer lead frames, said strips being of greater cross-sectional area than said leads but being of the same material.

4. A package according to claim 3 wherein each frame consists of a polymide material.

5. A package according to claim 3 wherein between said two frames each lead is provided with an enlarged contact pad area.

6. A package according to claim 3 wherein each strip is provided with at least one hole to assist in positioning the package in use.

7. A package according to claim 3 and an outer rim which interconnects and supports the second portions of said leads and each strip.

8. A package according to claim 7 wherein said outer rim is provided with at least one hole to assist in positioning the package in use.

9. A package according to claim 1 wherein one of said parts includes an insert of a material of relatively high thermal conductivity compared with the remainder of said one part, thereby to facilitate the conduction of heat away from the integrated circuit element.

10. A package according to claim 1 wherein said parts consist of ceramic material.

11. A package according to claim 10 wherein said parts consist of alumina.

12. A package according to claim 1 wherein said sealing means constitutes a glass seal.

* * * * *